United States Patent [19]
Mino

[11] Patent Number: 5,277,980
[45] Date of Patent: Jan. 11, 1994

[54] MASS OF FINE PARTICLES OF INORGANIC MATERIAL AND A FILM OF THE FINE INORGANIC PARTICLES

[75] Inventor: Norihisa Mino, Settsu, Japan

[73] Assignee: Matsushita Electric Industrial Co., Ltd., Osaka, Japan

[21] Appl. No.: 606,620

[22] Filed: Oct. 31, 1990

Related U.S. Application Data

[62] Division of Ser. No. 361,261, Jun. 5, 1989, Pat. No. 4,985,273.

[30] Foreign Application Priority Data

Jun. 7, 1988 [JP] Japan .................................. 63-139978
Jun. 28, 1988 [JP] Japan .................................. 63-160062
Feb. 27, 1989 [JP] Japan .................................. 1-045999

[51] Int. Cl.$^5$ .............................................. B32B 5/16
[52] U.S. Cl. ..................................... 428/403; 428/336; 428/405; 428/420; 428/447
[58] Field of Search ............... 428/403, 420, 447, 336, 428/405

[56] References Cited

U.S. PATENT DOCUMENTS

| 4,434,210 | 2/1984 | Nakajima et al. | 428/447 |
| 4,539,061 | 9/1985 | Sagiv | 428/420 |
| 4,992,300 | 2/1991 | Ogawa et al. | 428/447 |

FOREIGN PATENT DOCUMENTS 0417866  6/1986  European Pat. Off. ............ 428/405

Primary Examiner—P. C. Sluby
Assistant Examiner—H. Thi Lê
Attorney, Agent, or Firm—Stevens, Davis, Miller & Mosher

[57] ABSTRACT

The present invention concerns a field of dealing with inorganic fine particles, and provides a mass of the inorganic fine particles and method of producing the mass, and as applications of the method, an ultrathin film of inorganic fine particles and method of producing the ultrathin film, a magnetic recording medium and method of manufacturing the medium, and a method of manufacturing an inorganic pattern and method of manufacturing a inorganic wiring. Furthermore, the present invention provides the magnetic recording medium by covering the inorganic fine particles with a monomolecular film of a silane type surface active agent through chemical adsorption and permitting the inorganic fine particles and the monomolecular film to have functions.

15 Claims, 14 Drawing Sheets

MASS OF FINE PARTICLES OF INORGANIC MATERIAL AND A FILM OF THE FINE INORGANIC PARTICLES

This is a division of application Ser. No. 07/361,261, filed Jun. 5, 1989, now U.S. Pat. No. 4,985,273.

BACKGROUND OF THE INVENTION

The present invention relates to fine particles of an inorganic material, particularly to a mass of such inorganic fine particles and a method of providing such mass, an ultrathin film made from the mass of inorganic fine particles and a method of making such ultrathin film, a magnetic recording medium and a method of providing the magnetic recording medium and a method of manufacturing a pattern of an inorganic material (hereinafter referred to as inorganic pattern) and a method of manufacturing a wiring of an inorganic material (hereinafter referred to as inorganic wiring).

Hitherto, the mass of inorganic fine particles have been widely used as a wiring material, working material, recording material and printing material. A magnetic recording material and a method of making it will be illustrated below as one of the prior techniques.

In general, prior methods of making the magnetic recording mediums comprises steps of dispersing fine particles of a magnetic inorganic material into a synthetic resin as binder to prepare a magnetic paint and coating a thin and uniform layer of the magnetic paint onto a substrate to form a recording layer. Furthermore, in order to increase the coersive force of the medium, the methods may include a step of coating the magnetic paint onto a substrate and then placing the coated substrate in a magnetic field, thereby aligning the directions of the magnetic inorganic fine particles, followed by drying the substrate.

However, such prior methods of making the magnetic recording mediums are not preferred for obtaining a high density recording medium because they contain a large amount of non-magnetic synthetic resins as binder. Furthermore, the entirty of the magnetic fine particles cannot easily be oriented due to the viscosity of the binder in the prior methods.

As a further one of the prior techniques will be illustrated below a method of manufacturing a pattern of an inorganic material.

In this prior method, a given inorganic material is vapor deposited onto a substrate to form an inorganic thin film, then a predetermined pattern is provided on a photoresist through a photoresist process, and the inorganic thin film is etched over the photoresist as mask. Then, the photoresist is removed to form the inorganic pattern.

However, the prior methods in which the inorganic pattern is formed indirectly through a mask of photoresist comprise complicated process steps.

SUMMARY OF THE INVENTION

According to the present invention, the mass of fine particles of an inorganic material is characterized by comprising the inorganic fine particles and an organic thin film of molecules of an organic compound formed on the fine particles, these molecules being chemically bonded to each other.

For producing the mass of fine particles of an inorganic material of the present invention, the method is characterized by comprising steps of forming a monomolecular layer of an organic compound uniformly on the inorganic fine particles and subjecting the organic compound molecules formed on the inorganic fine particles to chemical or physical treatment to give chemical bonding of the organic compound molecules to each other.

In accordance with the present invention, this mass is used to make a magnetic recording material.

The ultrathin film of inorganic fine particles according to the present invention is characterized by comprising the inorganic fine particles fixed in a thin film form and an organic thin film made of molecules of organic compound on the inorganic fine particles, said organic molecules being chemically bonded to each other.

For making the ultrathin film of inorganic fine particles as described above, the method of the present invention is characterized by comprising steps of uniformly forming a monomolecular layer of organic compound molecules on the inorganic fine particles, then developing these inorganic fine particles on a gas-liquid interface and recovering these inorganic fine particles on a substrate, and subjecting the recovered fine particles to chemical or physical treatment to give chemical bonding of the organic compound molecules to each other.

The magnetic recording medium of the present invention is made by using fine particles of a magnetic inorganic material as the inorganic fine particles to form an ultrathin film which is a recording layer.

The method of manufacturing the inorganic pattern of the present invention is characterized by comprising steps of forming a monomolecule layer of an organic compound molecules on the surface of the inorganic fine particles, then subjecting the organic compound provided on the inorganic fine particles to chemical or physical treatment at a part to be provided with the pattern, and removing the inorganic fine particles from the part not subjected to any chemical or physical treatment.

Moreover, the method of manufacturing an inorganic wiring is characterized by using as the inorganic fine particles an electrically conductive material.

According to the present invention, the inorganic fine particles can easily be dealt with, and magnetization can be retained with good efficiency. Further, the ultrathin film of inorganic fine particles is novel and can be made with ease. Still further, the magnetic recording material and the method of producing it can expect high densification and highly oriented magnetic inorganic particles. The method of manufacturing the inorganic pattern and the method of manufacturing the inorganic wiring according to the present invention can directly form the inorganic pattern and inorganic wiring without use of any photoresist.

BRIEF DESCRIPTION OF THE DRAWINGS

FIG. 6 is an enlarged view of the encircled part B in FIG. 5.

FIG. 22 is an enlarged view of the encircled part E in FIG. 21, and FIG. 24 is an enlarged view of the encircled part F in FIG. 23.

DETAILED DESCRIPTIONS OF THE PREFERRED EMBODIMENTS

One embodiment of the mass of inorganic fine particles of the present invention will be illustrated below with reference to FIGS. 1 and 2.

Figure 1:
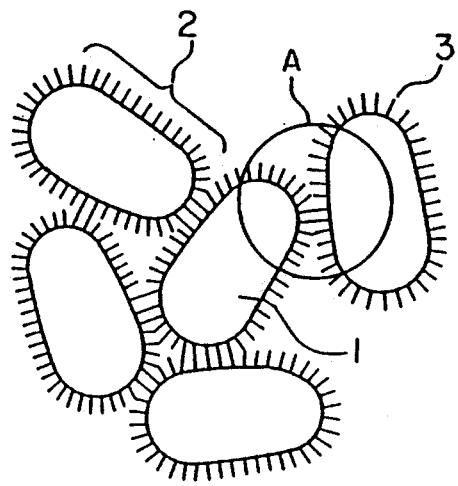
FIG. 1 is a diagrammatical cross-sectional view of the inorganic fine particles illustrating the mass of inorganic fine particles according to the present invention.
Figure 2:
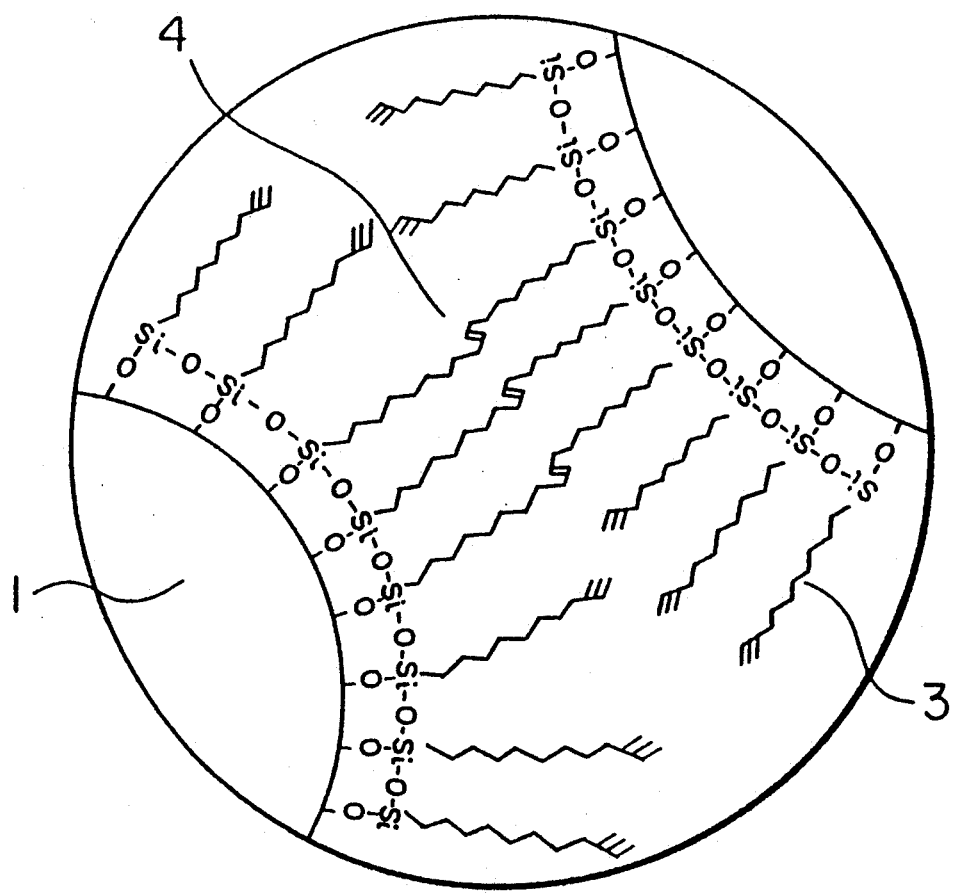
FIG. 2 is an enlarged view of the encircled part A in FIG. 1.

FIG. 2 diagrammatically illustrates the detail of the encircled part A in FIG. 1.

A silane type surface active agent is adsorbed and reacted on the surface of inorganic fine particles 1 to form a monomolecular film 2. The silane type surface active agent 3 has a functional group at the end thereof, which group is polymerized with the terminal functional group of the silane type surface active agent provided on the surface of the adjacent inorganic fine particles to form a chemical bonding 4, resulting in the formation of the mass of inorganic fine particles.

One embodiment of the method of producing the mass of inorganic fine particles according to the present invention is illustrated in the order of the steps in FIGS. 3, 4, 5 and 6.

Figure 6:
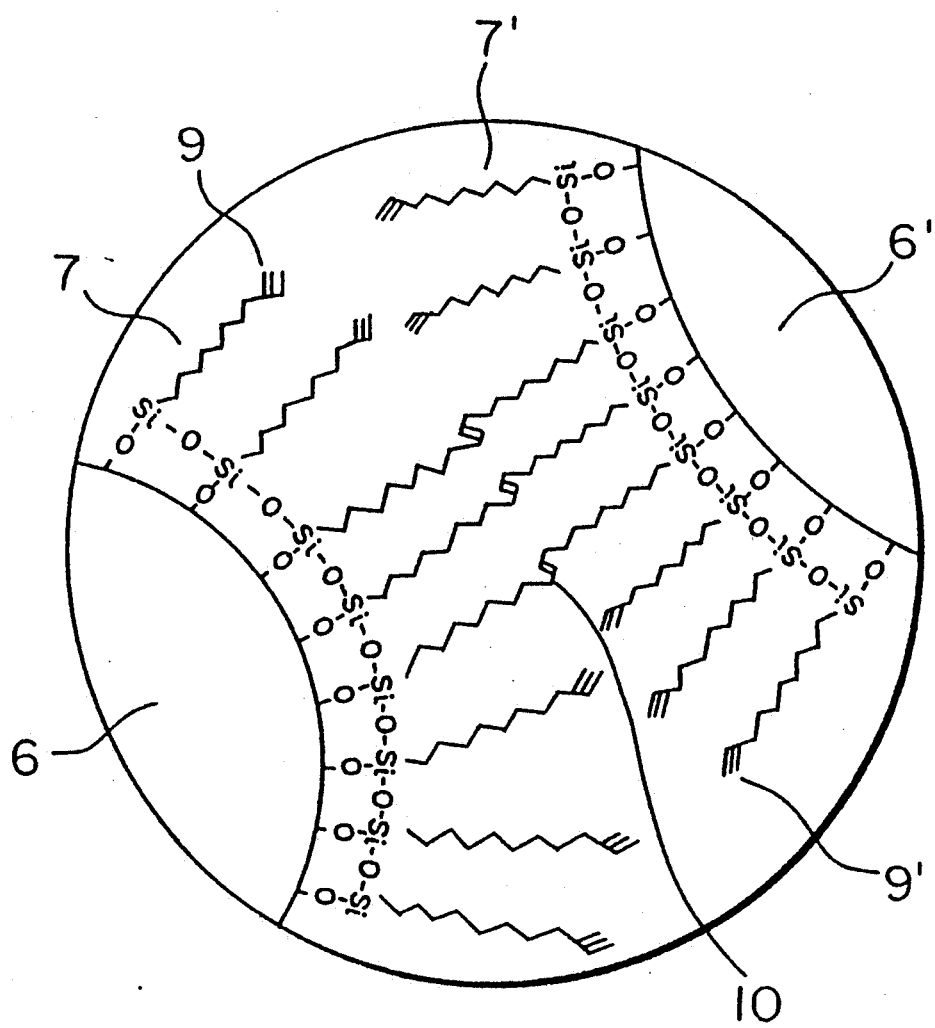

FIG. 6 is a diagrammatical view illustrating the detail of the mass enlarged within circle B.

A solution 5 comprised principally of n-hexadecane in which as the silane type surface active agent is conveniently dissolved $CH\equiv C-(CH_2)_n-SiCl_3$ wherein n is a positive integer, is prepared. Into this solution are immersed fine particles of an iron-nickel alloy as fine particles 6. Normally, oxide thin films are naturally formed on the surface of inorganic fine particles and hydroxyl groups are exposed. Therefore, the $-SiCl_3$ group and hydroxyl group undergo dehydrochlorination to form a monomolecular film 7 (2-3 nm thick) of the silane type surface active agent in the form of

Figure 3:
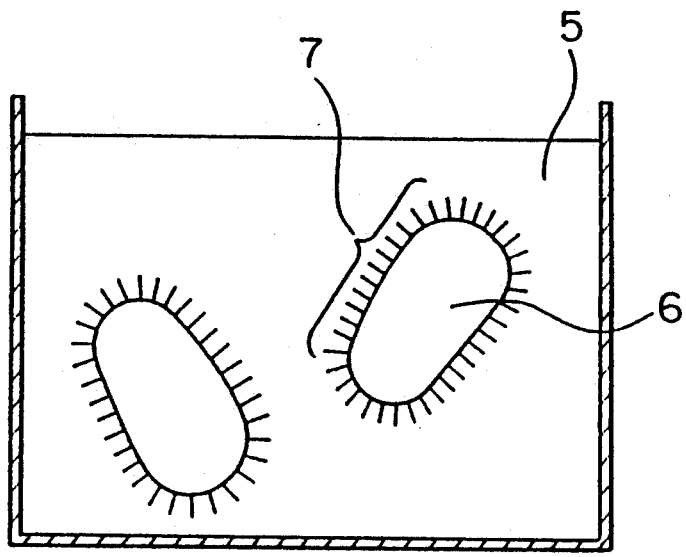
FIGS. 3 to 6 are diagrammatical views of the mass of inorganic fine particles in respective steps, which illustrate the method of producing the mass according to the present invention.

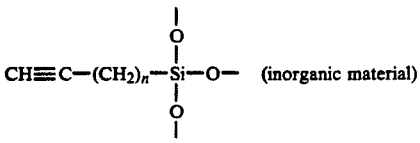
(inorganic material)

uniformly on the inorganic fine particles (see FIG. 3).

Figure 4:
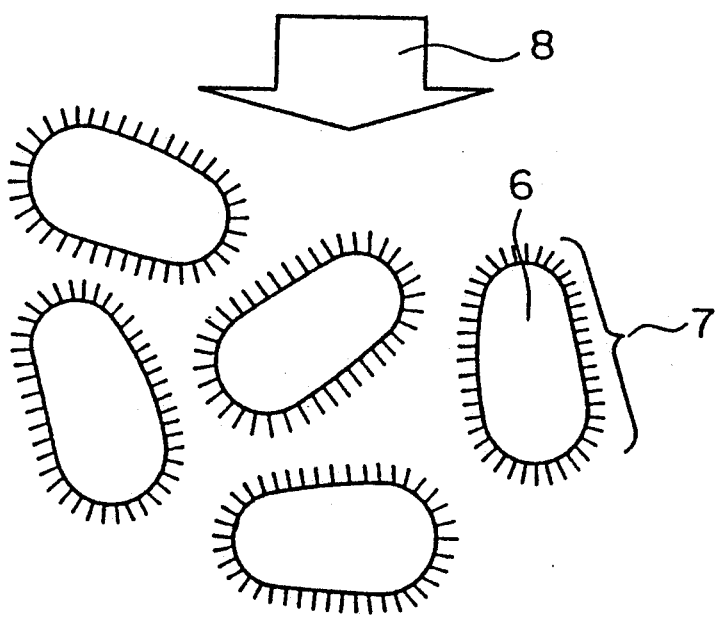

Then, the iron-nickel alloy fine particle uniformly covered with the monomolecular film 7 of silane type surface active agent are removed out and irradiated with an electron beam 8 with a predetermined density maintained (see FIG. 4).

Figure 5:
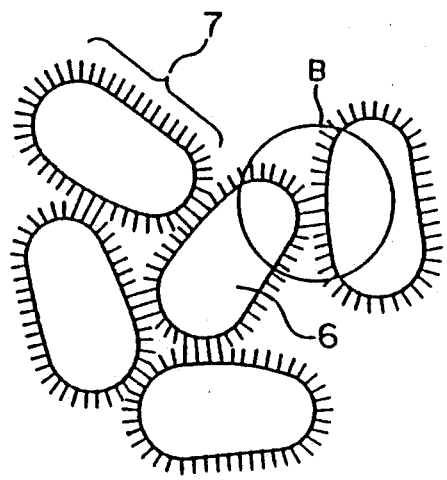

The electron beam irradiation allows a terminal acetylene group 9 of the monomolecular film 7 to be polymerized with a terminal acetylene group 9' of a monomolecular film 7' covering another adjacent iron-nickel alloy fine particle 6' thereby forming a chemical bonding 10 (see FIGS. 5 and 6).

Figure 7:
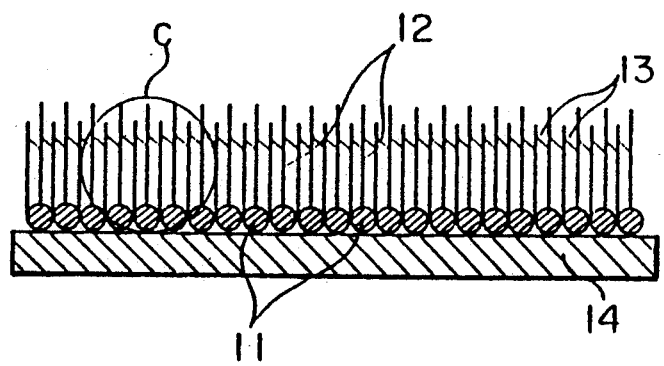
FIG. 7 is a diagrammatical cross-sectional view of one embodiment of the ultrathin film of inorganic fine particles according to the present invention.
Figure 8:
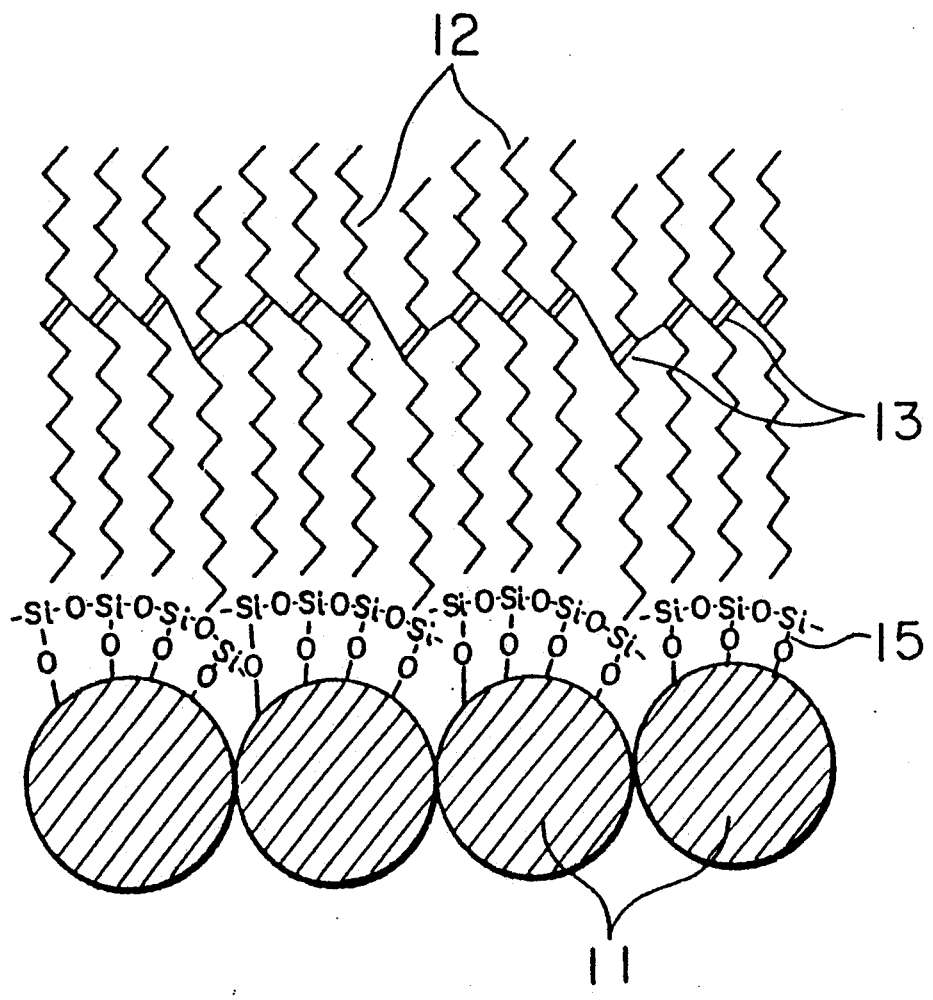
FIG. 8 is an enlarged view of the encircled part C in FIG. 7.

Another embodiment of the present invention will be illustrated below with reference to FIGS. 7 and 8. FIG. 7 is a diagrammatical cross-sectional view of the ultrathin film of inorganic fine particles, and FIG. 8 is an enlarged view of the encircled part C in FIG. 7.

Reference number 11 denotes inorganic fine particles of 100 Å in size. The inorganic fine particles 11 have a film of oxides of the particle-constituting ingredients on the surface thereof. On the oxide film are adsorbed organic compound molecules 12 having a straight-chain hydrocarbyl group, i.e., the silane type surface active agent. This silane type surface active agent 12 is chemically bonded to the adjacent silane surface active agent. Reference number 13 denotes a chemical bonding which is an ethylene bond. Reference number 14 denotes a substrate. As shown in FIG. 8, the silane type surface active agent 12 and the inorganic fine particles 11 form a siloxane bond 15 of

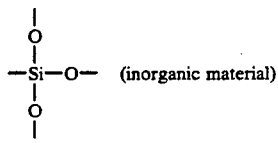
(inorganic material)

Therefore, the inorganic fine particles 11 are fixed with the silane type surface active agent 12, and this agent 12 is fixed with the chemical bonding 13 which is the ethylene bond. Thus, the maintenance of the inorganic fine particles 11 is excellent. In the present invention, the Langmuir-Blodgett's technique may be used and hence the ultrathin film of inorganic fine particles can be formed in the form of layer having a uniform thickness.

EXAMPLE 1

Figure 9:
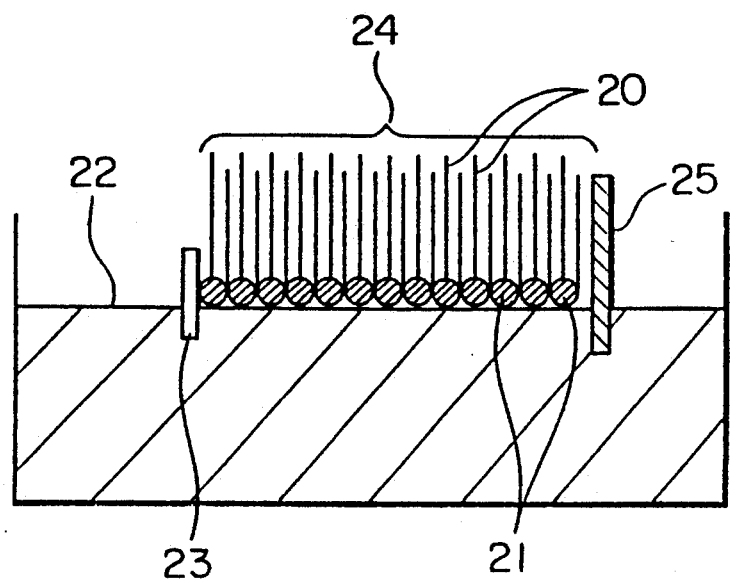
FIGS. 9 to 11 are diagrammatical cross-sectional views stepwise illustrating the method of making the ultrathin film of inorganic fine particles according to Examples 1 and 2 of the present invention.
Figure 10:
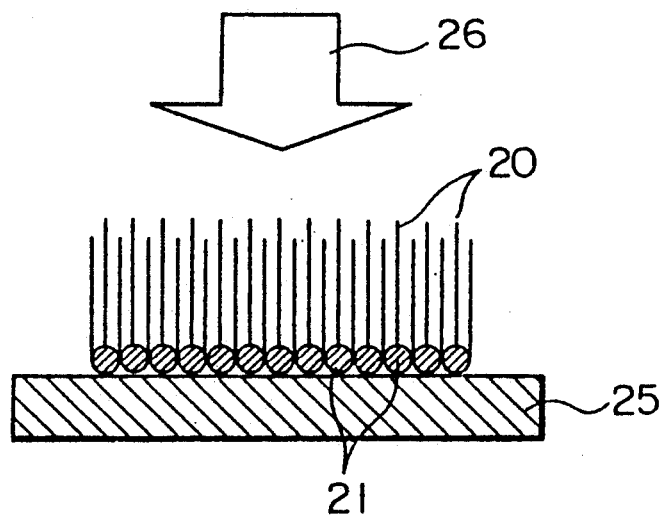
Figure 11:
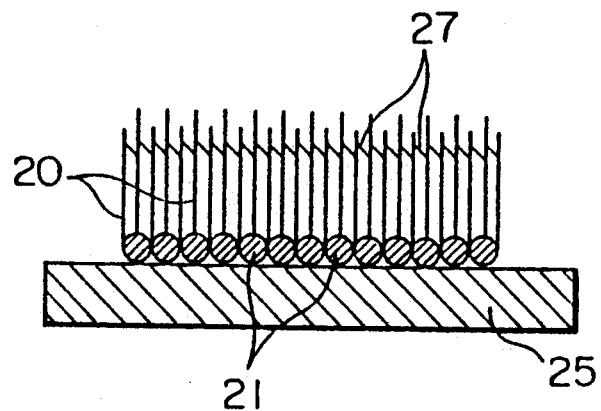

The method of producing the ultrathin film of magnetite fine particles according to the present invention will be illustrated stepwise with reference to FIGS. 9 to 11, which are all cross-sectional views.

As an organic compound to be adsorbed on the fine particles was used a silane type surface active agent 20 containing a chlorosilane group and ethylene bond

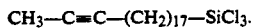

The agent was dissolved in a non-aqueous solvent comprised principally of chloroform. Inorganic fine particles 21 were placed in the resultant solution and agitated. The chlorosilane group was reacted with the film of oxides formed on the inorganic fine particles 21, which oxides were of the fine particle-constituting ingredients, to thereby form a siloxane bond which thus allowed the silane type surface active agent 20 to be adsorbed on the fine particles. The agent-adsorbed fine particles 21 were developed on the gas-liquid interface 22. Then, the fine particles 21 were gathered with a barrier 23 and then a proper pressure was applied to form an ultrathin film 24 of the fine particles. This ultrathin film 24 was transferred onto a substrate 25 of silicon. FIG. 9 shows the manner of the silane type surface active agent 20 being adsorbed on the entire surfaces of the fine particles 21, not three-dimensionally but two-dimensionally for simplification.

Then, an electron beam 26 was irradiated in an inert gas atmosphere of nitrogen on the ultrathin film of fine particles 24 formed on the substrate 25 (see FIG. 10).

The irradiation of the electron beam 26 allowed the acetylene bond of the silane type surface active agent 20 adsorbed on the surface of the inorganic fine particles 21 to be chemically reacted with the acetylene bond of the adjacent agent 20, thereby forming an ethylene bond 27. The ethylene bonds 27 were produced both between the acetylene bonds adjacent to each other on one fine particle and between the acetylene bonds on one fine particle and those on another fine particle. However, FIG. 11 diagrammatically shows the ethylene bonds for simplification.

EXAMPLE 2

The method of producing the ultrathin film of magnetite fine particles according to the present invention will be illustrated stepwise with reference to FIGS. 9 to 11, which are all cross-sectional views.

The procedures of Example 1 were repeated until the step of transferring the ultrathin film onto the substrate.

Subsequently, tantalum chloride as a catalyst comprising a transition metal of Groups V and VI of the Periodic Table or a compound thereof was dissolved in a non-aqueous solvent of toluene. Then, into the resultant solution was dipped the substrate having the ultrathin film of fine particles formed thereon. The dipping allowed the acetylene bonds of the silane type surface active agent to be chemically bonded to the adjacent acetylene bonds, thereby forming the ethylene bonds (see FIG. 11).

Figure 12:
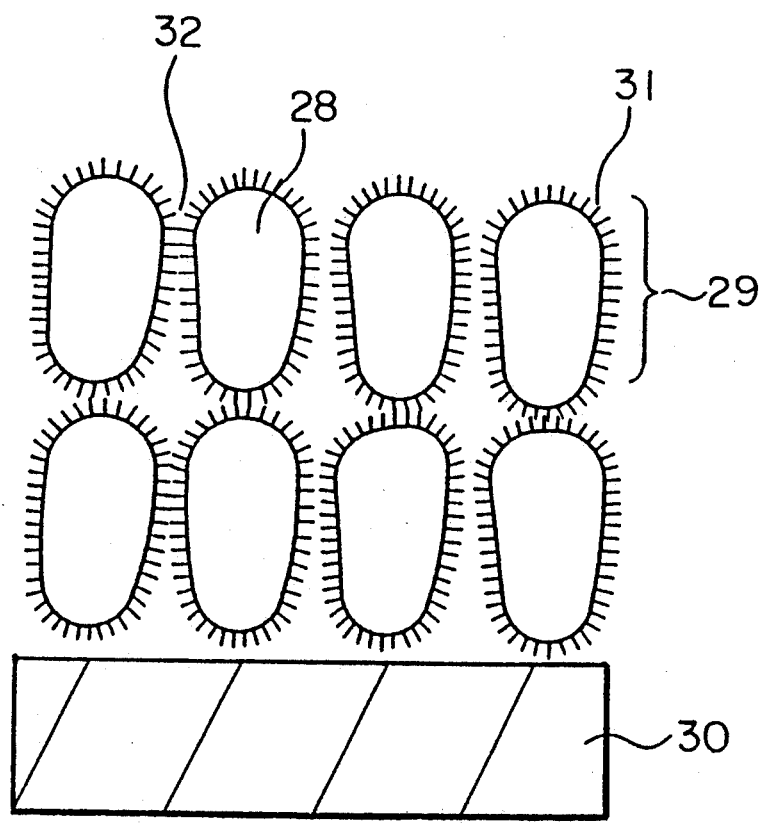
FIG. 12 is a diagrammatical view illustrating one embodiment of the magnetic recording medium using the inorganic fine particles of the present invention.

Then, an embodiment of a magnetic recording medium using the mass of the magnetite fine particles according to the present invention will be illustrated below with reference to FIG. 12.

On the surface of magnetic inorganic fine particles 28 is uniformly adsorbed a silane type surface active agent to form a monomolecular film 29. These magnetic inorganic fine particles are deposited on a substrate 30 to obtain the magnetic recording medium. The silane type surface active agent 31 constituting a mono-molecular film has a functional group at the end thereof. The magnetic inorganic fine particles 31 are oriented in some direction. Thereafter, polymerization is allowed to occur between the functional groups at the ends of the silane type surface active agents formed on the adjacent magnetic inorganic fine particles, thereby forming chemical bondings 32 and thus a mass of magnetic inorganic fine particles on the substrate.

Figure 13:
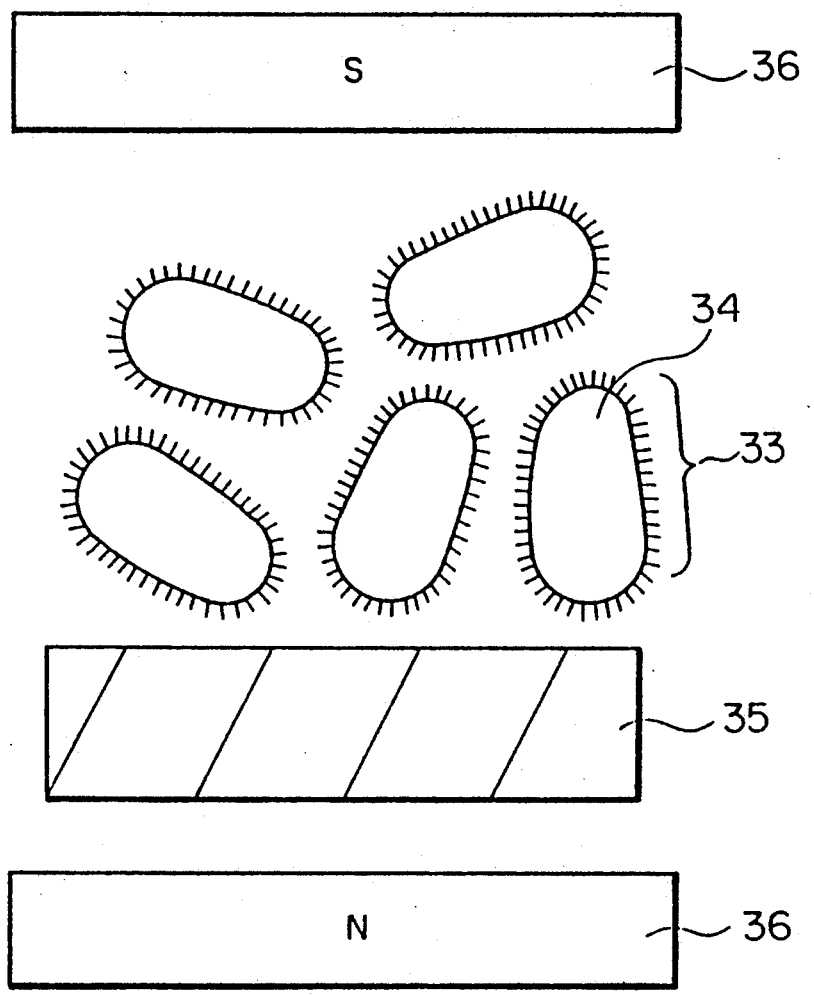
FIGS. 13 and 14 are diagrammatical cross-sectional views illustrating the magnetic recording medium using the inorganic fine particles in Example 1.
Figure 14:
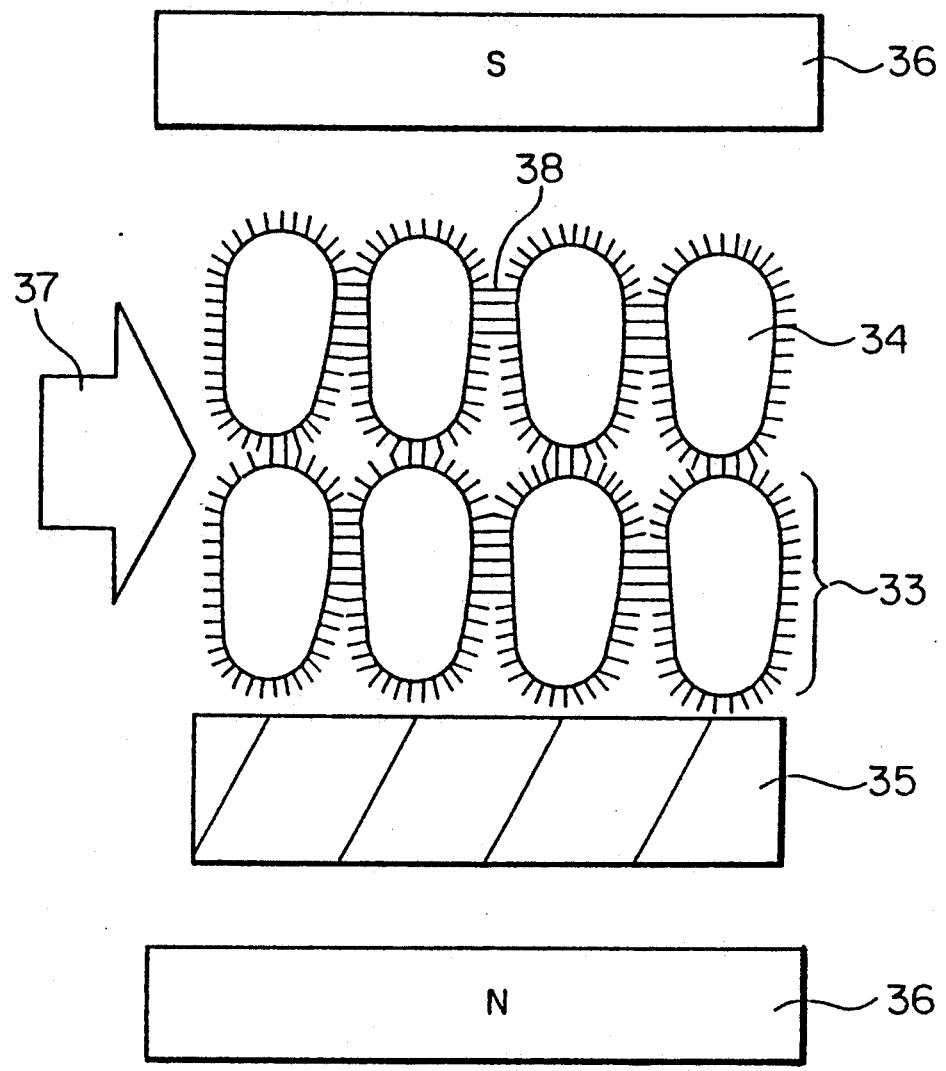

Next, a further embodiment of the method of manufacturing the magnetic recording medium using the inorganic fine particles according to the present invention will be illustrated below with reference to FIGS. 13 and 14.

As mentioned above for the method or producing the mass of inorganic fine particles, a solution comprised principally of n-hexadecane containing $CH\equiv C-(CH_2)_n-SiCl_3$ wherein n is a positive integer, dissolved therein is prepared. Into the resultant solution are immersed magnetic inorganic fine particles, e.g., magnetite fine particles. The magnetite is a magnetic iron oxide. Naturally, hydroxyl groups are exposed on the surface of the magnetite fine particles. In the case of magnetic inorganic particles other than oxides, a natural oxide thin film is in general formed on the magnetic inorganic fine particles and the hydroxyl groups are exposed. Therefore, the —$SiCl_3$ group of the silane type surface active agent and the exposed hydroxyl group undergo dehydrochlorination, thereby uniformly forming

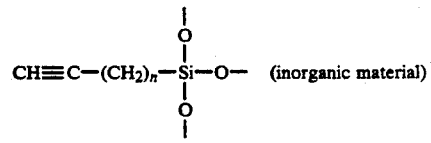

on the magnetic inorganic fine particles, thus forming a monomolecular film 33 (2–3 nm thick) comprising the silane type surface active agent. Then, the magnetic inorganic fine particles 34 uniformly covered with the monomolecular film 33 of silane type surface active agent are removed. The magnetic inorganic fine particles 34 are applied onto a substrate 35. In order to orient the magnetic inorganic fine particles, a magnetic field 36 is applied to the substrate 35 with a proper angle to the substrate. In this embodiment, the magnetic field is applied in a direction perpendicular to the substrate (see FIG. 13).

By applying the magnetic field 36 the magnetic inorganic fine particles 34 are oriented. An energy beam, e.g., electron beam 37 is irradiated against the substrate with this state maintained at a predetermined density. This irradiation of the electron beam allows the acetylene group at the end of the monomolecular film 33 comprising the silane type surface active agent to be polymerized with the acetylene group at the end of the adjacent monomolecular film to form a chemical bonding 38, whereby the fine particles are fixed (see FIG. 14).

Figure 15:
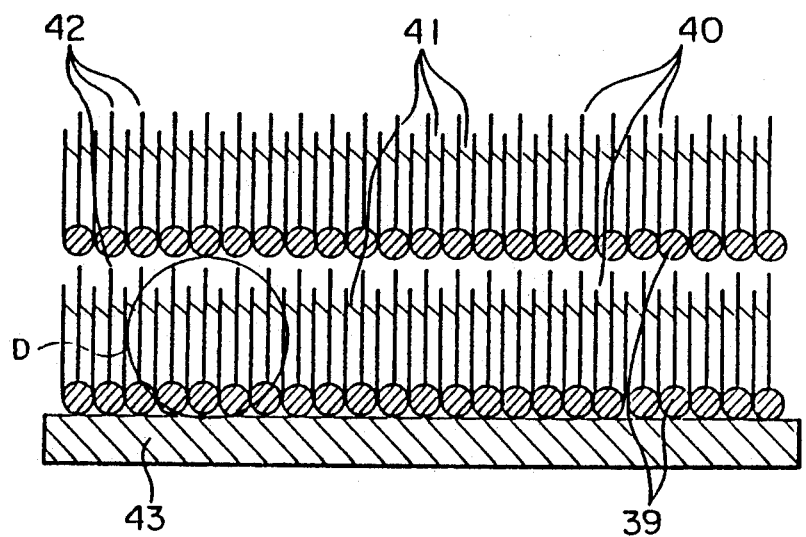
FIG. 15 is a diagrammatical cross-sectional view illustrating one embodiment of the magnetic recording medium using the inorganic fine particles of the present invention.
Figure 16:
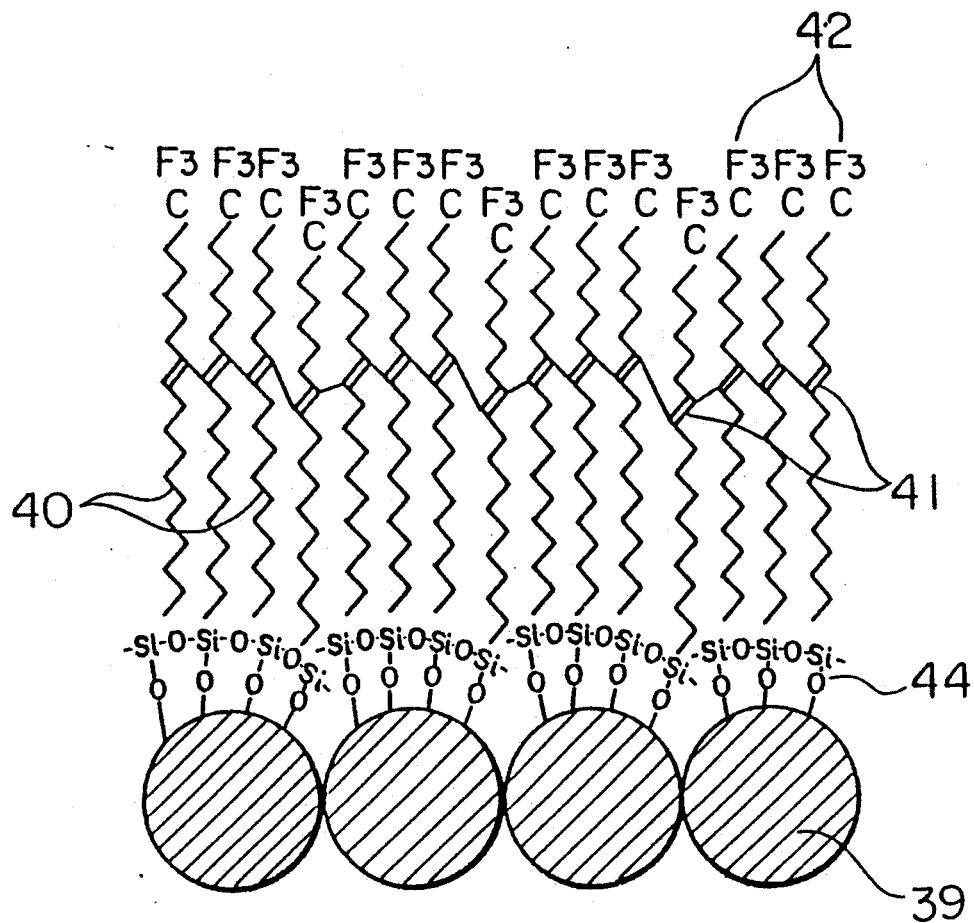
FIG. 16 is an enlarged view of the encircled part D in FIG. 15.

A still further embodiment of the magnetic recording medium using the inorganic fine particles according to the present invention will be illustrated below with reference to FIGS. 15 and 16. FIG. 15 is a diagrammatical cross-sectional view of the magnetic recording medium, and FIG. 16 is an enlarged view of the encircled part D in FIG. 15.

Figure 17:
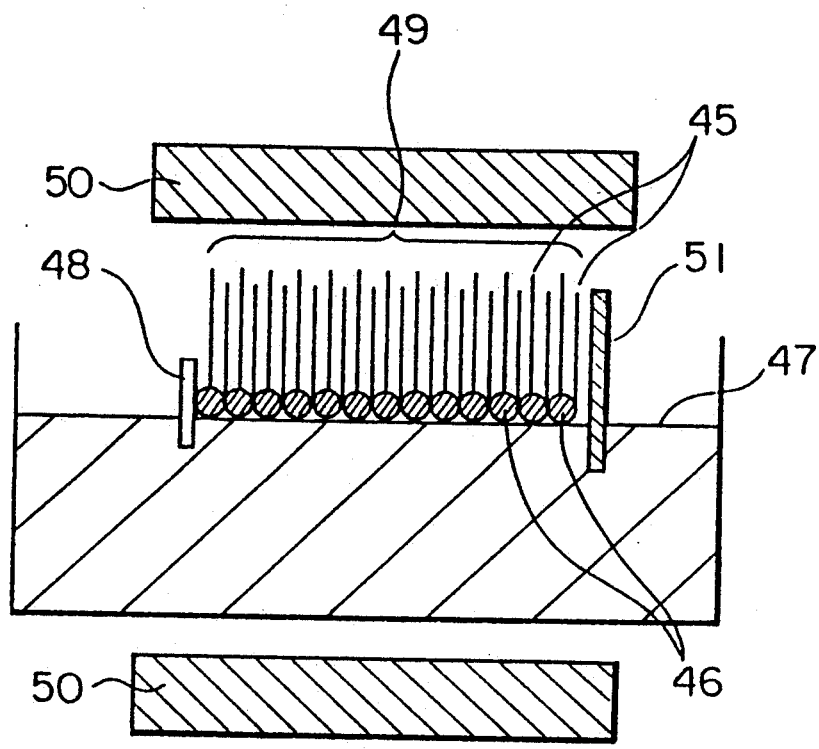
FIGS. 17 to 20 are diagrammatical cross-sectional views stepwise illustrating the method of producing the magnetic recording medium using the mass of inorganic fine particles in Example 2 of the present invention.

Reference number 39 denotes magnetic inorganic fine particles of about 100 Å in size. A film of oxides of the ingredients constituting the magnetic inorganic fine particles is formed on the surface of the magnetic inorganic fine particles 39. On this oxide film are adsorbed a silane type surface active agent 40 of an organic compound having a straight-chain hydrocarbyl group. This silane type surface active agent 40 is chemically bonded to the adjacent silane type surface active agent. Reference number 41 denotes a chemical bonding, i.e., ethylene bond between the silane type surface active agents. Reference number 42 denotes a fluorine substituting site provided at the end of the silane type surface active agent 40. Reference numeral 43 denotes a substrate. As shown in FIG. 17, the silane type surface active agent 40 forms a siloxane bond 44 of

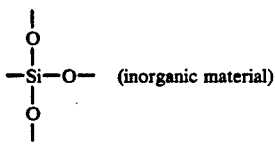

together with the magnetic inorganic fine particles 39. Therefore, the magnetic inorganic fine particles 39 are fixed with the silane type surface active agent 40. Further, the silane type surface active agent 40 is fixed with the chemical bond 41 of ethylene bond. Thus, the maintenance of the magnetic inorganic fine particles is excellent. In the present invention, the Langmuir-Blodgett's technique may be used and hence the ultrathin film of inorganic fine particles can be formed in the form of layer having a uniform thickness.

The surface of the ultrathin film of the magnetic inorganic fine particles is always covered with fluorine atoms by replacing the terminal hydrogen atoms of the silane type surface active agent 40 with the fluorine atoms. Therefore, the ultrathin film is excellent in wear resistance when used for a magnetic head. Furthermore, the ultrathin film of magnetic inorganic fine particles can be formed in a lamellar form and hence magnetic properties as desired can easily be obtained.

EXAMPLE 3

An actual embodiment of the method of manufacturing the magnetic recording medium using the ultrathin film of magnetite fine particles according to the present invention will be illustrated below with reference to FIGS. 17 to 20, which are all cross-sectional views.

As an organic compound to be adsorbed on magnetic fine particles was used a silane type surface active agent 45 having a straight-chain hydrocarbyl group containing a chlorosilane group, trifluoromethyl group and acetylene group, i.e., having the formula of $$CF_3-C\equiv C-(CH_2)_{17}-SiCl_3.$$

This agent was dissolved in a solvent comprised principally of chloroform. Into the resultant solution were placed the magnetic fine particles 46 and agitated. The chlorosilane group was reacted with the film of oxides of the ingredients constituting the magnetic fine particles to form a siloxane bond, thus the silane type surface active agent 45 being adsorbed on the magnetic fine particles. The agent-adsorbed magnetic fine particles 46 were developed on a gas-liquid interface 47 and gathered by a barrier 48. These magnetic fine particles were changed under a proper pressure in an ultrathin film 49. In this case, a magnetic field 50 was applied to orient the magnetic fine particles 46. The ultrathin film of magnetic fine particles was transferred onto a substrate 51 of silicon. FIG. 17 shows the manner of the silane type surface active agent 45 being formed on the entire surfaces of the fine particles 46, not three-dimensionally but two-dimensionally for simplification.

Figure 18:
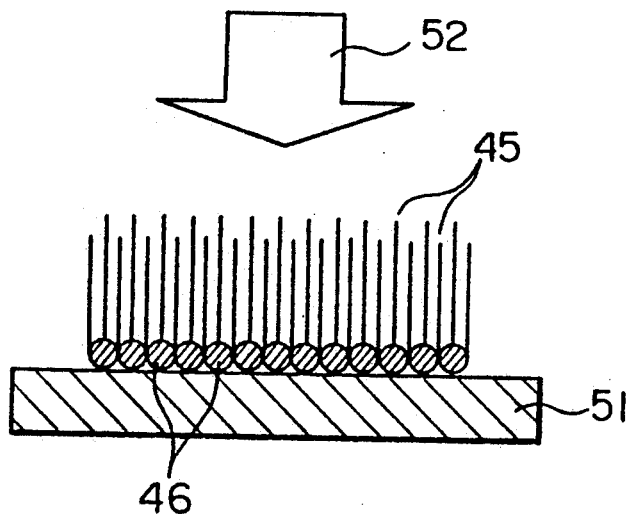

Then, to the ultrathin film 49 of magnetic fine particles formed on the substrate 51 was irradiated an energy beam of electron beam 52 (see FIG. 18).

Figure 19:
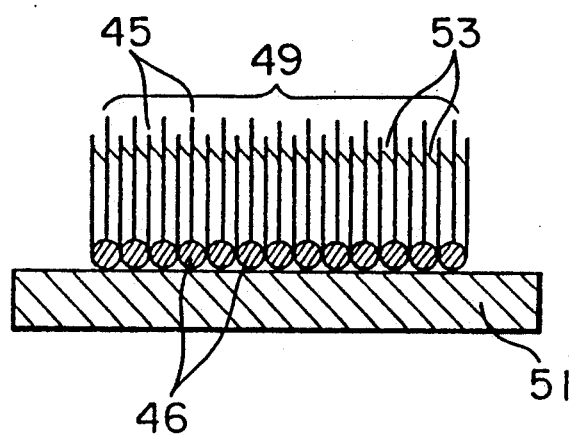

The irradiation of the electron beam 52 allowed the acetylene bond of the silane type surface active agent 45 adsorbed on the surface of the magnetic fine particles 46 to be chemically reacted with the acetylene bond of the adjacent agent 45, thereby forming an ethylene bond 53. The ethylene bonds 53 were produced both between the acetylene bonds adjacent to each other on one fine particles 46 and between the acetylene bonds on one fine particle and those on another fine particle. However, FIG. 19 diagrammatically shows the ethylene bonds for simplification.

Figure 20:
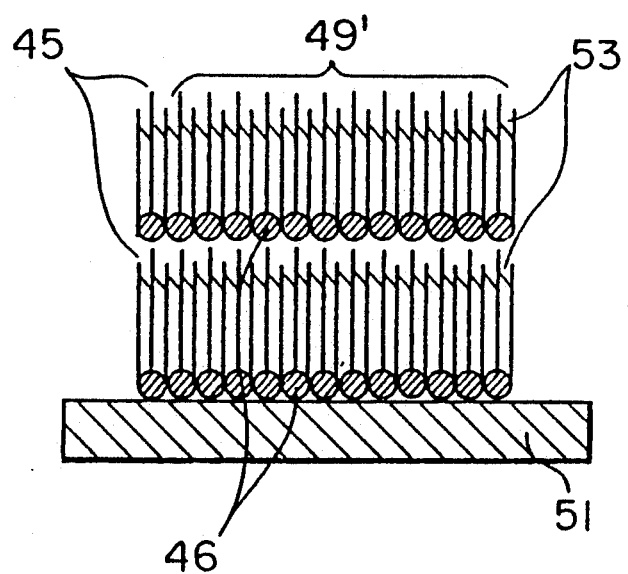

In accordance with the same procedures as shown in FIGS. 17 and 18, a further ultrathin film 49' of the magnetic inorganic fine particles was accumulated on the ultrathin film 49 of magnetic inorganic fine particles to obtain the magnetic recording medium of the present invention (see FIG. 20).

Next, one embodiment of the method of manufacturing the inorganic pattern according to the present invention will be illustrated below with reference to FIGS. 21 to 25, which are all cross-sectional views.

Inorganic fine particles 54, for example, fine particles of an aluminum-silicon alloy, are immersed in a non-aqueous solution of a silane type surface active agent 55, for example, $CH\equiv C-(CH_2)_n-SiCl_3$ wherein n is a positive integer contained in a solvent comprised principally of n-hexadecane. The silane type surface active agent 55 has the $-SiCl_3$ group and straight-chain hydrocarbyl chain at the bottom end thereof and a functional group such as acetylene group 56 at the other end thereof. Since the inorganic fine particles has a naturally-oxidized film on the surface thereof, a hydroxide group is exposed. The hydroxide group and the $-SiCl_3$ group undergo the dehydrochlorination to form.

Figure 21:
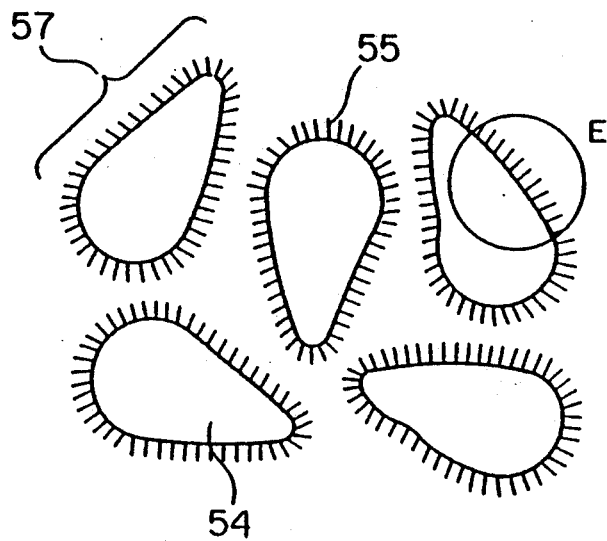
FIGS. 21 to 25 are diagrammatical cross-sectional views illustrating the method of manufacturing the inorganic pattern of the present invention.
Figure 22:
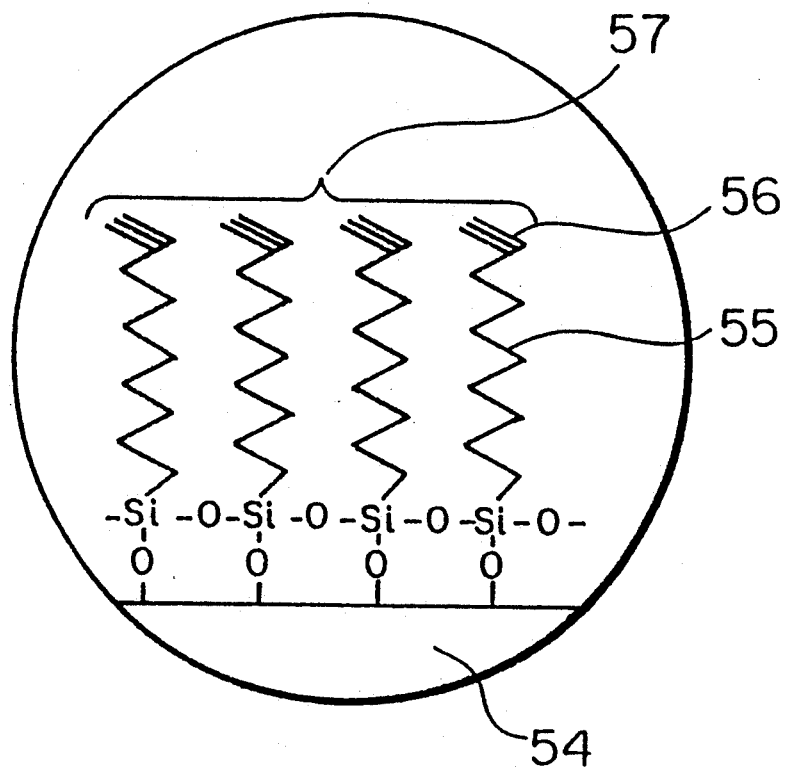
Figure 23:
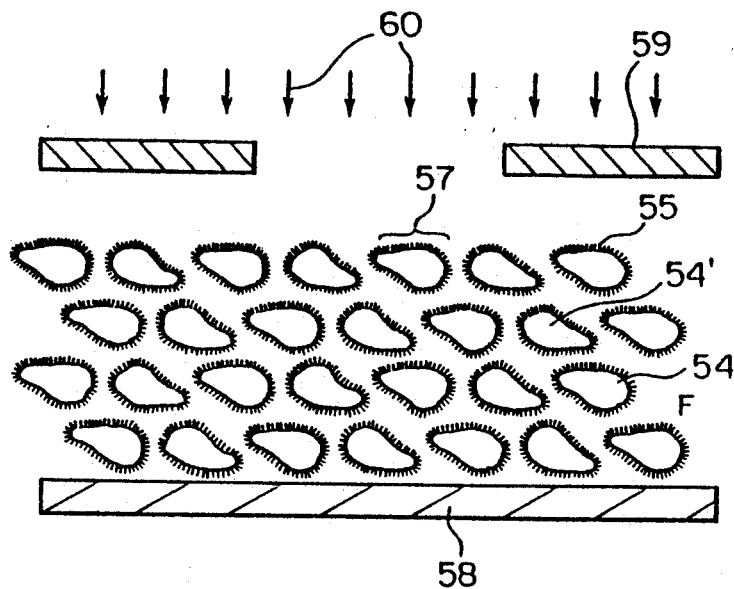

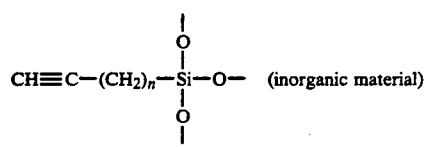

uniformly on the inorganic fine particles, thus forming a monomolecular film 57 (2-3 nm thick) of the silane type surface active agent (see FIGS. 21 and 22; FIG. 22 is an enlarged view of the encircled part E in FIG. 21).

Then, the inorganic fine particles 54 of an aluminum-silicon alloy entirely and uniformly covered with the monomolecular film 57 of the silane type surface active agent are removed and dissolved in a non-aqueous solvent such as chloroform. The solution is coated on a substrate 58 and the solvent is vaporized to form a film of the inorganic fine particles on the substrate. Then, a mask 59 is positioned on the substrate 58 and an energy beam 60 is irradiated through the mask against the film at the selected pattern alone. The energy beam may be, for example, an electron beam.

Figure 24:
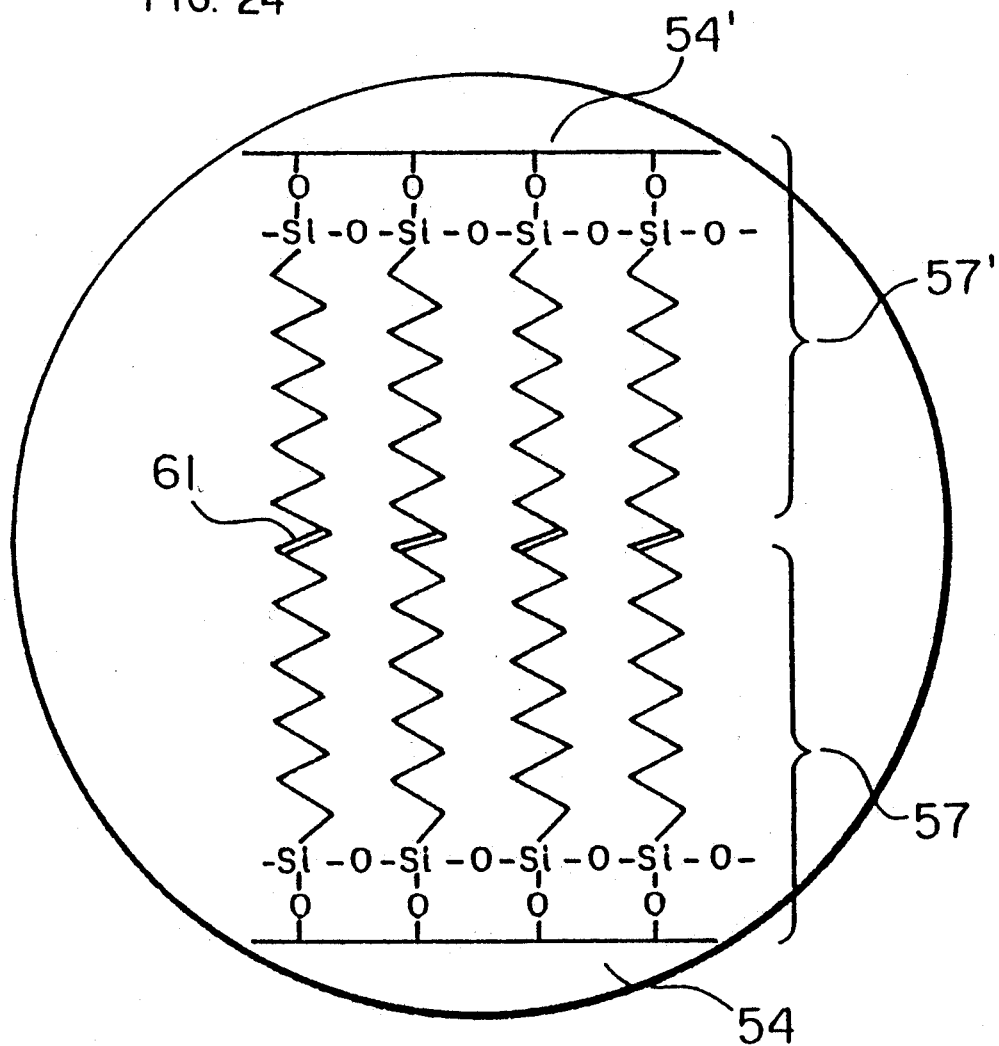

Acetylene groups at the ends of the mono-molecular films 57 and 57' of silane type surface active agent 55 formed on the adjacent inorganic fine particles 54 and 54', respectively are polymerized with each other to form a chemical bonding 61. Thus, the inorganic fine particles of an aluminum-silicon alloy are selectively fixed through the chemical bonding by selectively irradiating the energy beam (see FIG. 23 and 24; FIG. 24 is an enlarged view of the encircled part F in FIG. 23).

Then, the film of inorganic fine particles selectively irradiated with an energy beam is immersed in a solvent such as chloroform. The inorganic fine particles not irradiated with an energy beam and having no chemical bonding are removed by the immersion. As a result, the inorganic fine particles at the part irradiated with an energy beam are retained on the substrate 58 to form the inorganic pattern (see FIG. 25).

Figure 25:
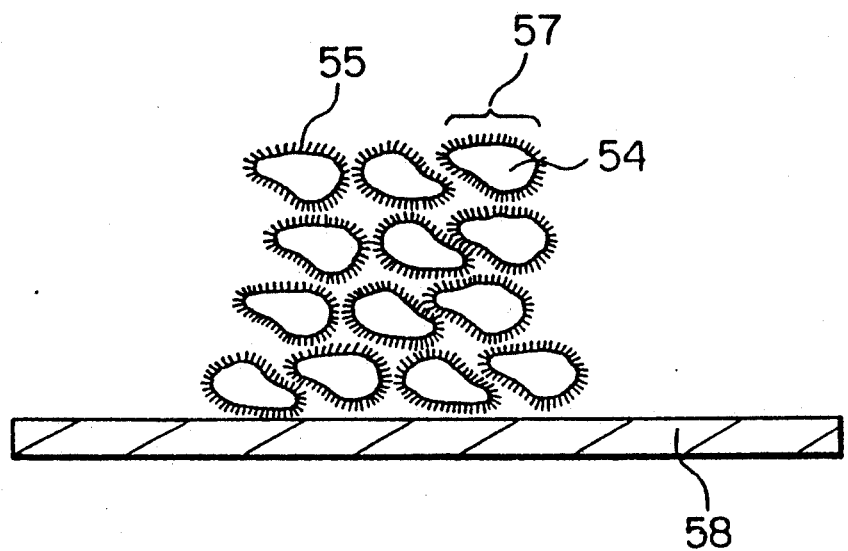
Figure 26:
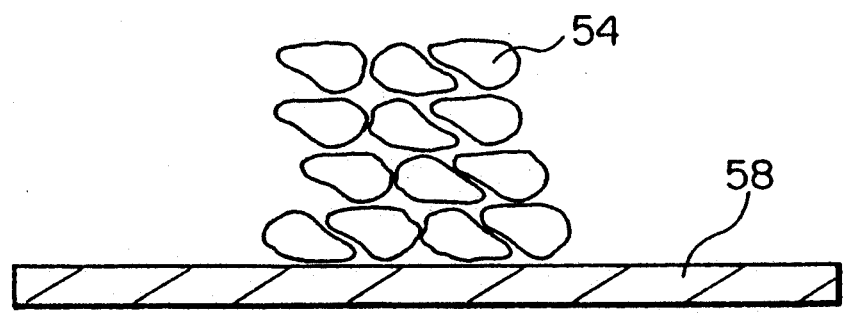
FIG. 26 is a diagrammatical cross-sectional view illustrating the method of manufacturing the inorganic wiring according to the present invention.

Next, one embodiment of the method of manufacturing an inorganic wiring using the method of manufacturing the inorganic pattern will be illustrated below with reference to FIGS. 25 and 26.

In accordance with the method of manufacturing the inorganic pattern, the inorganic pattern comprising inorganic particles 54 to be used for wiring is formed on a substrate 58 on which the wiring is to be formed. The substrate having the inorganic pattern formed thereon is then heated in an atmosphere of an inert gas such as nitrogen gas to a temperature of 400° C. This heat treatment in an inert gas atmosphere can decompose and remove away the monomolecular film 57 of an electric conductivity-preventing silane type surface active agent 55 to form the inorganic wiring of inorganic fine particles on the substrate 58 (see FIGS. 25 and 26).

The inorganic material used in the present invention may be aluminum, aluminum-silicon alloy, aluminum-copper alloy, aluminum-silicon-copper alloy, platinum, palladium, titanium, tantalum, chromium, tin, tungsten, molybdenum, magnetite and etc.

The drawings attached hereto all are diagrammatical cross-sectional views but it is needless to say that the various chemical bondings are made three-dimensionally.

In the examples of the present invention as described above, the acetylene group was used as the unsaturated bond of the silane type surface active agent, but other unsaturated bonds, for example, vinyl group and diacetylene group, which allows the polymerization to occur, may be used in the present invention. Furthermore, not only the unsaturated bonds but also any other groups such as epoxy group may be used.

In the examples of the present invention as described above, the silane type surface active agent having a terminal chlorosilane group was used but any other surface active agents which having a group capable of being adsorbed on inorganic materials may be used, for example, triazine dithiol derivatives may be used. When the triazine dithiol derivatives are used, no non-aqueous solvent needs to be used and no siloxane bonding is formed.

In the examples of the present invention as described above, an electron beam was used as the energy beam, but it is needless to say that ultraviolet rays, far ultraviolet rays, X-ray and gamma rays to be used may conveniently be changed depending upon the kinds of the terminal functional groups of the silane type surface active agents used.

In the examples of the present invention as described above, a magnetic field was used in producing the magnetic recording medium, but it is needless to say that an electric field may be used.

In place of the coating technique used for applying the magnetic inorganic fine particles onto the substrate in manufacturing the magnetic recording medium with the mass of inorganic fine particles as described in the examples of the present invention above, other applying techniques such as casting may be used.

The ultrathin film of inorganic fine particles as described in the examples of the present invention above has one or two layers, but it is needless to say that multi-layered or accumulated ultrathin films may be made as desired.

In the method of producing the ultrathin film of inorganic fine particles and the method of manufacturing the magnetic recording medium with the ultrathin film above, the energy beam was irradiated against the substrate having the inorganic fine particles transferred thereon, but the energy beam may be irradiated against the inorganic fine particles on the gas-liquid interface, followed by transferring the irradiated particles onto the substrate.

In order to raise up the orientability of the inorganic fine particles, the methods of producing the ultrathin film of inorganic fine particles and of manufacturing the magnetic recording medium according to the present invention may adopt application or magnetic field to the ultrathin film on the gas-liquid interface when the inorganic fine particles are sensitive to magnetism, or application of magnetic or electric field to the ultrathin film when the energy beam is irradiated.

In the method of producing the ultrathin film of inorganic fine particles as described in Example 2 above, the catalytic polymerization was used, but it is needless to say that this catalytic polymerization is possible in other methods of the present invention. Furthermore, in Example 2 above, catalysts comprising the transition metals of Groups V and VI of the Periodic Table or compounds thereof were used, but any catalysts which allow the silane type surface active agents to be chemically bonded to each other may be used.

In the examples with the magnetic recording medium using the ultrathin film of the present invention as described above, an energy beam was irradiated against the substrate having the magnetic inorganic fine particles transferred thereon, but the energy beam may be applied to the inorganic fine particles on the gas-liquid interface, followed by transferring the particles onto the substrate.

In the examples with the magnetic recording medium using the ultrathin film of the present invention as described above, the magnetic field was applied to the ultrathin film of magnetic inorganic fine particles on the gas-liquid interface, but it may be applied together with the energy beam, in order to raise up the orientability of the particles.

In the examples with the method of manufacturing the inorganic wiring of the present invention the heat treatment was carried out at a temperature of 400° C., but it is needless to say that the temperature can be changed depending upon the kinds of the silane type surface active agents, so that the agents may be decomposed and removed away.

By the method of manufacturing the inorganic pattern according to the present invention, the inorganic wiring was made in the example as described above, but in addition this method is applicable to metal electrodes, particularly bump bonding or microbump bonding which requires fine metal patterns.

In the example of the method of manufacturing the inorganic pattern according to the present invention as described above, a mask was used for selectively irradiating the energy beam, but the electron beam or the like may be applied through a direct drawing technique. Thus, this direct drawing technique may be utilized in the present invention.

The mass of inorganic fine particles and the method of producing the mass, the magnetic recording medium with the mass and the method of producing the medium, the ultrathin film of inorganic fine particles and the method of manufacturing the film, and the magnetic recording medium with the ultrathin film and the method of manufacturing the medium, according to the present invention, provide novel technical fields of dealing with inorganic fine particles. Furthermore, the magnetic recording medium with inorganic fine particles and the method of producing the medium according to the present invention can realize high densification without using any binder which is a problem prior magnetic paints have. Furthermore, there is no orientation hindrance due to the viscosity of binder and the orientation of particles can be made with ease in the present invention, since no binder is used. When the present invention is used for producing a perpendicular magnetization magnetic recording medium, a high performance magnetic recording medium can very easily be made. Still further, the mass of inorganic fine particles and the method of producing the mass and the ultrathin film of inorganic fine particles and the method of producing the film according to the present invention are applicable to wiring materials, working materials such as abrasives, a way of conveying the inorganic fine particles, coating materials, painting materials, photosensitive recording materials, printing materials, catalysts and the like.

The method of manufacturing the inorganic pattern and the method of manufacturing the inorganic wiring according to the present invention are novel ones which do not require expensive apparatuses such as that used in prior sputtering technique. Furthermore, the methods of the present invention require no steps of forming photoresist pattern, dry-etching of inorganic thin films, and removing the photoresist but can directly form the inorganic pattern or wiring. Thus, the present invention contributes greatly to industries.

What is claimed is:

1. A mass of fine particles of an inorganic material of 100 μm or less in size, where each particle is covered with a monomolecular film of silane surfactant, at least part of said monomolecular film is chemically bonded to the monomolecular film formed on the surfaces of adjacent fine particles of inorganic material.

2. The mass of fine particles of inorganic material according to claim 1, wherein a film of oxides of inorganic material constituting-ingredients is formed on the surface of the fine particles of inorganic material.

3. The mass of fine particles of an inorganic material according to claim 2, wherein said inorganic material is at least one of aluminum, aluminum-silicon alloy, aluminum-copper alloy, aluminum-silicon-copper alloy, platinum, titanium, tantalum, chromium, tin, tungsten, molybdenum and magnetite.

4. The mass of fine particles of inorganic material according to claim 1, wherein end groups on one side of said silane surfactant and the fine particles of inorganic material form a siloxane bond of

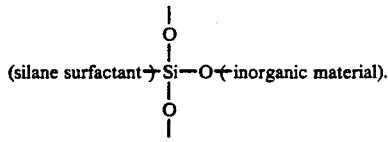

5. The mass of fine particles of inorganic material according to claim 1, wherein said silane surfactant comprises a straight hydrocarbon chain.

6. The mass of fine particles of inorganic material according to claim 5, wherein a number of the $CH_2$ group forming the straight-chain hydrocarbon of said silane surfactant is 10 or more.

7. The mass of fine particles of inorganic material according to claim 1, wherein said silane surfactant contains a polymerizable functional group.

8. The mass of fine particles of inorganic material according to claim 7, wherein the polymerizable functional group included in the silane surfactant chemically adsorbed on the surface of the fine particles of inorganic material is chemically bonded to the polymerizable functional group included in the silane surfactant chemically adsorbed on the surface of at least one of the adjacent fine particles of inorganic material.

9. A film of fine particles of inorganic material having a thickness corresponding to the particle size of the fine particles, which comprises fine particles of inorganic material of 100 μm or less in size, wherein a monomolecular film of a silane surfactant formed on the surface of each of said fine particles of inorganic material, comprise at least part of the functional groups included in said silane surfactant being chemically bonded to each other.

10. The film of inorganic fine particles according to claim 9, wherein a film of oxides of inorganic fine particle constituting-ingredients is formed on the surface of the inorganic fine particle.

11. The film of inorganic fine particles according to claim 9, wherein end groups on one side of said silane surface active agent and the inorganic fine particles form a siloxane bond of

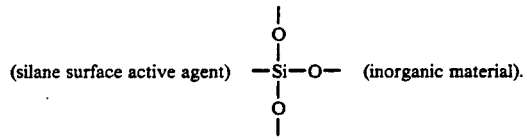

12. The film of inorganic fine particles according to claim 9, wherein said silane surface active agent comprises a straight hydrocarbon chain.

13. The film of inorganic fine particles according to claim 12, wherein a number of the $CH_2$ group forming the straight-chain hydrocarbon of said silane surface active agent is 10 or more.

14. The film of inorganic fine particles according to claim 9, wherein said silane surface active agent contains a functional group.

15. The film of inorganic fine particles according to claim 14, wherein the functional group included in the silane surface active agent chemically adsorbed on the surface of the inorganic fine particles is chemically bonded to the functional group included in the silane surface active agent chemically adsorbed on the surface of at least one of the adjacent inorganic fine particles.

* * * * *